United States Patent
Hwang et al.

(10) Patent No.: US 11,005,274 B2
(45) Date of Patent: May 11, 2021

(54) SENSING APPARATUS AND BATTERY MANAGEMENT SYSTEM INCLUDING THE SAME

(71) Applicant: SAMSUNG ELECTRONICS CO., LTD., Suwon-si (KR)

(72) Inventors: Hyosun Hwang, Seoul (KR); DongKee Sohn, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 593 days.

(21) Appl. No.: 15/816,345

(22) Filed: Nov. 17, 2017

(65) Prior Publication Data

US 2018/0145521 A1 May 24, 2018

(30) Foreign Application Priority Data

Nov. 18, 2016 (KR) .................. 10-2016-0153866

(51) Int. Cl.
| | |
|---|---|
| H02J 7/00 | (2006.01) |
| G01R 31/382 | (2019.01) |
| G01R 31/389 | (2019.01) |
| G01R 31/396 | (2019.01) |
| B60L 58/22 | (2019.01) |
| G01R 31/371 | (2019.01) |
| G01R 31/36 | (2020.01) |

(52) U.S. Cl.
CPC .......... *H02J 7/0021* (2013.01); *B60L 58/22* (2019.02); *G01R 31/382* (2019.01); *G01R 31/389* (2019.01); *G01R 31/396* (2019.01); *H02J 7/0014* (2013.01); *H02J 7/00036* (2020.01); *B60L 2240/545* (2013.01); *B60L 2240/547* (2013.01); *B60L 2240/549* (2013.01); *G01R 31/3648* (2013.01); *G01R 31/371* (2019.01); *Y02T 10/70* (2013.01)

(58) Field of Classification Search
CPC ...... H02J 7/0021; H02J 7/00036; B60L 58/22
See application file for complete search history.

(56) References Cited

U.S. PATENT DOCUMENTS

| | | | |
|---|---|---|---|
| 8,571,738 B1 | 10/2013 | Potter et al. | |
| 9,395,417 B2 * | 7/2016 | Song ................. | H02J 7/0031 |
| 10,033,201 B2 * | 7/2018 | Kaneko .............. | H01M 10/482 |
| 10,120,033 B2 * | 11/2018 | Cho .................. | B60R 16/033 |
| 10,505,377 B2 * | 12/2019 | Jeon ................. | H02J 7/0021 |
| 2012/0046893 A1 * | 2/2012 | Kaneko .............. | B60L 58/18 |
| | | | 702/63 |

(Continued)

FOREIGN PATENT DOCUMENTS

| | | |
|---|---|---|
| JP | 2011-155825 A | 8/2011 |
| JP | 2013-510556 A | 3/2013 |

(Continued)

*Primary Examiner* — Richard V Muralidar
(74) *Attorney, Agent, or Firm* — NSIP Law

(57) ABSTRACT

A sensing apparatus includes a sensor configured to sense a physical quantity of a battery, a memory configured to store one or both of physical quantity data corresponding to the sensed physical quantity and status information of the battery, a first interface configured to transmit one or both of the physical quantity data and the status information to a master processor and a second interface configured to provide an interface between a slave processor and the memory.

12 Claims, 8 Drawing Sheets

(56) References Cited

U.S. PATENT DOCUMENTS

2015/0185289 A1   7/2015   Yang et al.

FOREIGN PATENT DOCUMENTS

| KR | 10-2012-0004670 A | 1/2012 |
| KR | 10-2013-0025561 A | 3/2013 |
| KR | 10-2013-0053885 A | 5/2013 |
| KR | 10-1406685 B1 | 6/2014 |
| KR | 10-2014-0143076 A | 12/2014 |
| KR | 10-2015-0020958 A | 2/2015 |
| KR | 10-2016-0027764 A | 3/2016 |

* cited by examiner

SENSING APPARATUS AND BATTERY MANAGEMENT SYSTEM INCLUDING THE SAME

CROSS-REFERENCE TO RELATED APPLICATION(S)

This application claims the benefit under 35 USC § 119(a) of Korean Patent Application No. 10-2016-0153866, filed on Nov. 18, 2016, in the Korean Intellectual Property Office, the entire disclosure of which is incorporated herein by reference for all purposes.

BACKGROUND

1. Field

The following description relates to a sensing apparatus and a battery management system that includes the sensing apparatus.

2. Description of Related Art

A sensor included in a slave battery management system (BMS) may measure voltage, current, temperature, etc., of a battery. The sensor may have a communication feature and may transmit sensing data to a master MBS using the communication feature. The master BMS may monitor the battery based on the sensing data.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a sensing apparatus includes a sensor configured to sense a physical quantity of a battery, a memory configured to store one or both of physical quantity data corresponding to the sensed physical quantity and status information of the battery, a first interface configured to transmit one or both of the physical quantity data and the status information to a master processor and a second interface configured to provide an interface between a slave processor and the memory.

The slave processor may read the physical quantity data and write the status information to the memory using the second interface, the status information being determined based on the physical quantity data stored in the memory.

The second interface may be further configured to transmit information about an operation status of the sensing apparatus to the slave processor.

The slave processor may be configured to access the memory and to read the physical quantity data in response to the operation status being a sensing complete status, determine the status information based on the physical quantity data, and write the status information to the memory.

The status information may be stored in the memory separately from the physical quantity data.

The status information may include any one or any combination of a charging status and a lifespan status of the battery and information regarding whether the battery is in an abnormal status, prediction information regarding whether the battery is abnormal, a balancing status of the battery, an internal resistance status of the battery, and prediction information about a temperature of the battery.

The battery may include battery cells. The second interface may be further configured to transmit physical quantity data of each of the battery cells to the slave processor. The slave processor may be configured to determine status information of each of the battery cells based on the physical quantity data of each of the battery cells, determine cell balancing based on status information of each of the battery cells and output a result indicative thereof, and generate control information to control a balancer corresponding to each of the battery cells based on the result.

The sensing apparatus may further include a controller configured to control the sensor in response to a sensing command from the master processor, to change an operation status of the sensing apparatus in response to completion of storing of the physical quantity data, to control the second interface to transmit information about the changed operation status to the slave processor, and to control the first interface to transmit one or both of the status information and the physical quantity data stored in the memory to the master processor.

The sensing apparatus may further include a display configured to display one or both of the sensed physical quantity and the status information of the battery.

In one general aspect, a battery management system includes a slave battery management device configured to correspond to a battery, and a master battery management device configured to communicate with the slave battery management device. The slave battery management device includes a sensor configured to sense a physical quantity of the battery, a memory configured to store one or both of physical quantity data corresponding to the sensed physical quantity and status information of the battery, a first interface configured to transmit one or both of the physical quantity data and the status information to the master battery management device and a second interface configured to provide an interface between a slave processor and the memory.

The slave processor may read the physical quantity data and writes the status information to the memory using the second interface, the status information being determined based on the physical quantity data stored in the memory.

The second interface may be further configured to transmit information about an operation status of the slave battery management device to the slave processor.

The slave processor may be configured to access the memory and to read the physical quantity data in response to the operation status being a sending complete status, determine the status information based on the physical quantity data, and write the status information to the memory.

The status information may be stored in a different area of the memory than an area in which the physical quantity data is stored.

The status information may include any one or any combination of a charging status and a lifespan status of the battery and information regarding whether the battery is in an abnormal status, prediction information regarding whether the battery is abnormal, a balancing status of the battery, an internal resistance status of the battery, and prediction information about a temperature of the battery.

The battery may include battery cells. The second interface may be further configured to transmit physical quantity data of each of the battery cells to the slave processor. The slave processor may be configured to determine cell balancing based on the physical quantity data of each of the battery cells and output a result indicative thereof, and may generate control information to control a balancer corresponding to each of the battery cells based on the result of.

The slave battery management device further includes a controller configured to control the sensor in response to a sensing command from the master battery management device, to change an operation status of the slave battery management device in response to completion of storing of the physical quantity data, to control the second interface to transmit information about the changed operation status to the slave processor, and to control the first interface to transmit one or both of the status information and the physical quantity data stored in the memory to the master battery management device.

In one general aspect, a method of a sensing apparatus includes sensing a physical quantity of a battery, transmitting the physical quantity data to a slave processor through a first interface in response to storing the physical quantity data in a memory, receiving status information of the battery from the slave processor through the first interface, and transmitting one or both of the physical quantity data and the status information to a master processor through a second interface.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
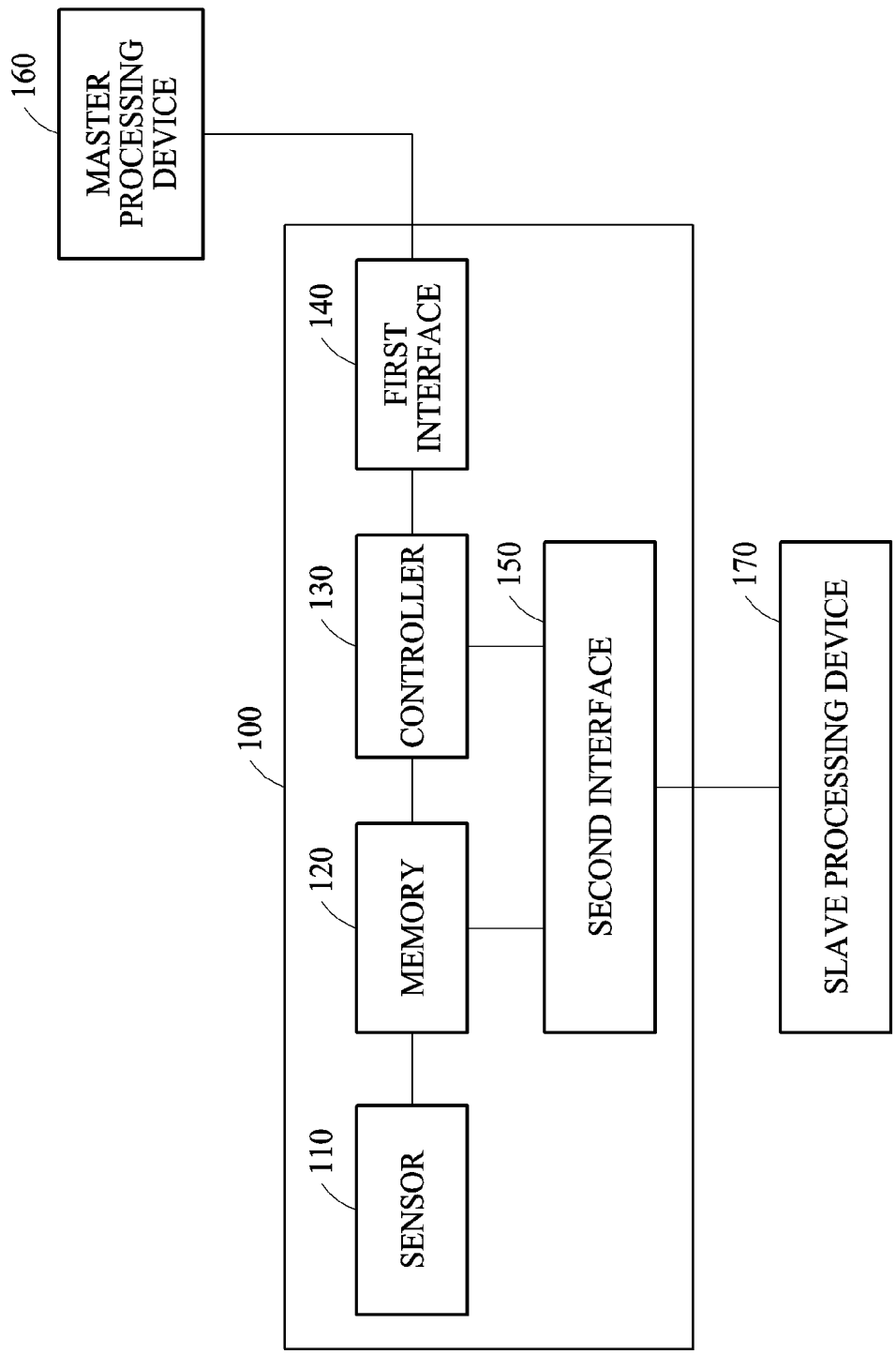
FIG. 1 is a block diagram illustrating an example of a sensing apparatus.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The features of the examples described herein may be combined in various ways as will be apparent after an understanding of the disclosure of this application. Further, although the examples described herein have a variety of configurations, other configurations are possible as will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

It will be understood that when a component is referred to as being "connected to" another component, the component can be directly connected or coupled to the other component or intervening components may be present.

As used herein, the singular forms are intended to include the plural forms as well, unless the context clearly indicates otherwise. It should be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof.

Unless otherwise defined herein, all terms used herein including technical or scientific terms have the same meanings as those generally understood by one of ordinary skill in the art. Terms defined in dictionaries generally used should be construed to have meanings matching with contextual meanings in the related art and are not to be construed as an ideal or excessively formal meaning unless otherwise defined herein.

Hereinafter, examples will be described in detail with reference to the accompanying drawings, and like reference numerals in the drawings refer to like elements throughout. When it is determined that detailed description related to the known art may make the example embodiments unnecessarily ambiguous, the detailed description is omitted.

FIG. 1 illustrates an example of a sensing apparatus.

Referring to FIG. 1, a sensing apparatus 100 includes a sensor 110, a memory 120, a controller 130, a first interface 140, and a second interface 150.

The sensing apparatus 100 receives a sensing command from a master processing device 160. The master processing device 160 may transmit the sensing command to the sensing apparatus 100 at predetermined intervals. For example, if a previous period $Period_{n-1}$ associated with determining of status information is terminated and a current period $Period_n$ associated with determining of status information starts, the master processing device 160 may transmit the sensing command to the sensing apparatus 100. Alternatively, if an execution period is set for the master processing device 160 to send a sensing command to the sensing apparatus 100, the master processing device 160 may periodically transmit the sensing command to the sensing apparatus 100. The first interface 140 of the sensing apparatus 100 receives the sensing command from the master processing device 160.

In response to the sensing command being received at the sensing apparatus 100, an operation status of the sensing apparatus 100 may be changed to an active status. For example, in response to the received sensing command, the controller 130 may change the operation status of the sensing apparatus 100 from an idle status to an active status.

The controller 130 controls the sensor 110 in response to the sensing command.

The sensor 110 may sense a physical quantity related to a battery unit. The battery unit may represent, for example, a battery cell, a battery module, a battery pack, etc. The physical quantity may include, for example, one of current, voltage, temperature, and impedance of the battery unit, etc., or a combination thereof. The sensor 110 senses at least one of the current, the voltage, the temperature, and the impedance of the battery unit.

The sensor 110 may include one of a voltage sensor, a current sensor, a temperature sensor, and an impedance sensor, etc. or a combination thereof. The sensor or sensors of sensor 110 may be an analog sensor or a digital sensor, or any combination of an analog sensor and a digital sensor.

In response to the sensor 110 sensing the physical quantity of the battery unit, the operation status of the sensor 110 may be changed to a sensing status. For example, in response to the sensor 110 sensing the physical quantity of the battery unit, the controller 130 may change the operation status of the sensing apparatus 100 from an active status to a sensing status.

The sensor 110 may include an analog-to-digital converter (ADC) (not shown). The sensed physical quantity may be an electrical signal of analog. The sensor 110 samples the sensed physical quantity using the ADC. Accordingly, the sensed physical quantity may be converted to a digital signal. That is, physical quantity data (digital data) corresponding to the sensed physical quantity may be acquired. For example, the physical quantity data may include voltage data, current data, temperature data, and impedance data, or a combination thereof.

The sensor 110 may calibrate the physical quantity data. For example, the physical quantity data may have noise, for example, white noise. The sensor 110 may remove the noise by calibrating the physical quantity data. In response to calibration, the operation status of the sensing apparatus 100 may be changed from a sensing status to a calibration status. Depending on examples, the sensor 110 may not perform calibration.

The memory 120 receives the physical quantity data from the sensor 110 and stores the physical quantity data. The memory 120 may include, for example, a dynamic random access memory (DRAM), a static RAM (SRAM), a synchronous dynamic RAM (SDRAM), a ferroelectrics RAM (FRAM), a magneto-resistive RAM (MRAM), or the like. However, the above examples are provided as non-limiting examples and the memory 120 may include various types of devices configured to store data.

Once storage of physical quantity data is completed, the operation status of the sensing apparatus 100 may be changed to a sensing complete status. For example, the controller 130 may change the operation status of the sensing apparatus 100 from a calibration status to a sensing complete status. If calibration is not performed, the controller 130 may change the operation status of the sensing apparatus 100 from a sensing status to a sensing complete status.

In response to the operation status of the sensing apparatus 100 being the sensing complete status, the second interface 150 transmits information about the operation status of the sensing apparatus 100 to a slave processing device 170. For example, the second interface 150 may transmit, to the slave processing device 170, information indicating that the sensing apparatus 100 is in the sensing complete status under control of the controller 130.

In response to receiving information indicating that the sensing apparatus 100 is in the sensing complete status, the slave processing device 170 accesses the memory 120 through the second interface 150. The slave processing device 170 reads the physical quantity data from the memory 120. The slave processing device 170 determines status information of the battery unit based on the physical quantity data. The status information may include at least one of information about a charging status, for example, status of charge (SOC), information about a lifespan status, for example, status of health (SOH), information about how much time or distance remains in the device being powered by the battery before the battery becomes discharged based on battery usage statistics, information regarding whether the battery unit is in an abnormal status, for example, information regarding whether a danger level or a safety level of the battery unit exceeds a threshold and is in a danger area, information regarding whether fault is present in the battery unit, information regarding whether leakage current has occurred, etc., a balancing status of the battery unit, an internal resistance status of the battery unit, and prediction or measurement information about a temperature of the battery unit. A lifespan status may correspond to an amount of charge and discharge cycles remaining in the battery's lifetime. Also, the status information may include prediction information regarding whether the battery unit is abnormal. The prediction information regarding whether the battery unit is abnormal may represent information associated with a predication indicating a presence or an absence of a probability that the battery unit is not currently in an abnormal status, however, may enter into the abnormal status in the future. The prediction information regarding whether the battery unit is abnormal may include, for example, information associated with a prediction indicating that the danger level may exceed the threshold considering a current use pattern of the battery unit and information associated with a prediction indicating that the battery unit may malfunction at a future point in time considering a current use pattern of the battery unit. The slave processing device 170 may determine status information corresponding to a current period $Period_n$ and/or prediction information, such as prediction information regarding whether the battery unit is abnormal, based on physical quantity data acquired during the current period $Period_n$.

The slave processing device 170 controls the battery unit based on physical quantity data and/or status information of the battery unit. For example, if a temperature of the battery unit is above a reference temperature range, for example, 10° C. to 35° C., the slave processing device 170 may perform a cooling process. If the temperature of the battery unit is below the reference temperature range, for example, 10° C. to 35° C., the slave processing device 170 may perform a heating process. A temperature may be controlled for each battery unit. As another example, if status information of the battery unit is not in a balancing status, the slave processing device 170 may perform a balancing process. Balancing is described with reference to FIGS. 3 through 5.

The slave processing device 170 accesses the memory 120 through the second interface 150. The slave processing device 170 writes the status information of the battery unit into the memory 120. The slave processing device 170 may write the status information in an area different from an area in which physical quantity data is stored within the memory 120. Status information corresponding to a previous interval may be stored in advance in another area of the memory 120. For example, status information corresponding to Period$_{n-1}$, status information corresponding to Period$_{n-2}$, etc., may be stored in the memory 120.

Status information of the battery unit may be stored in the memory 120. The memory 120 stores status information corresponding to Period$_n$. Also, the memory 120 stores the aforementioned prediction information.

The controller 130 periodically transmits data predetermined at the master processing device 160 to the master processing device 160. For example, in response to a request from the master processing device 160, the controller 130 transmits information corresponding to the request to the master processing device 160.

For example, the controller 130 may periodically transmit the predetermined data, for example, physical quantity data acquired during Period$_n$ and/or status information corresponding to a previous period, to the master processing device 160 through the first interface 140. Here, in response to the master processing device 160 requesting the controller 130 to transmit status information corresponding to the current period Period$_n$, the controller 130 may transmit status information corresponding to the current period Period$_n$ to the master processing device 160. The predetermined data is not limited to the above example.

In one example, in response to an occurrence of an emergency event, for example, a detection of an abnormal status from the battery unit, the controller 130 may transmit information about the abnormal status and physical quantity data to the master processing device 160 through the first interface 140. Here, the controller 130 may assign a high priority to a transmission of information about the abnormal status and physical quantity data. That is, in response to the occurrence of the emergency event, information about the abnormal status and physical quantity data may be prioritized highly and most initially transmitted to the master processing device 160.

The master processing device 160 may receive physical quantity data and/or status information from the sensing apparatus 100 and optional additional sensing apparatuses corresponding to other battery units. However, configurations are not limited thereto. For example, a single sensing apparatus could be used to transmit physical quantity data and/or status information for one or more battery units. In this way, the master processing device 160 may check a status of each of the battery units. Thus, the master processing device 160 determines status information of a battery pack that includes multiple battery units based on the received information.

Figure 2:
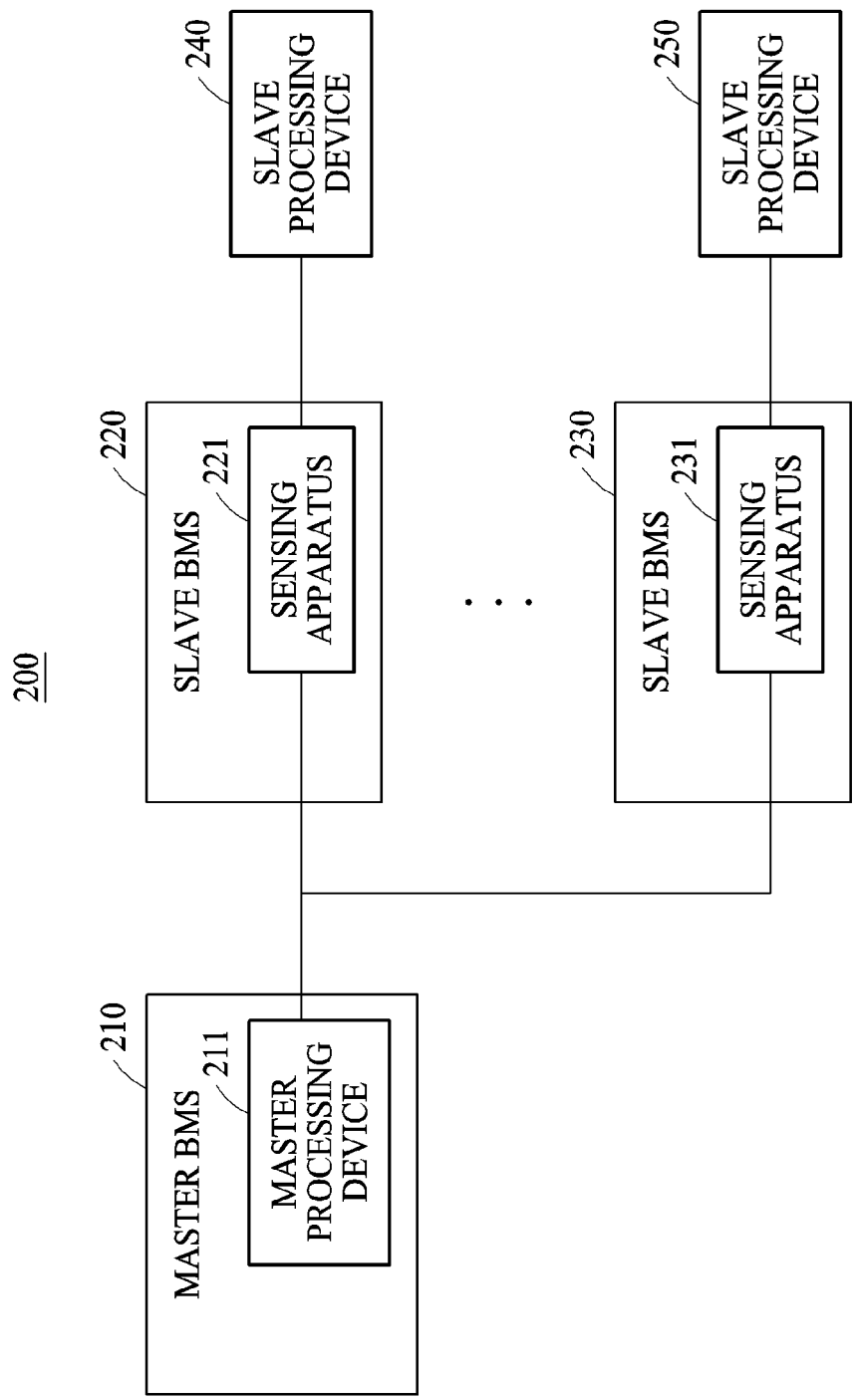
FIG. 2 is a block diagram illustrating an example of a battery management system.

FIG. 2 illustrates an example of a battery management system (BMS).

Referring to FIG. 2, a BMS 200 includes a master BMS 210 and a plurality of slave BMSs 220 and 230.

The master BMS 210 includes a master processing device 211, the slave BMS 220 includes a sensing apparatus 221, and the slave BMS 230 includes a sensing apparatus 231.

Each of the sensing apparatuses 221 and 231 includes a first interface and a second interface (such as first interface 140 and second interface 150 of FIG. 1). The first interface enables interfacing between the master processing device 211 and the sensing apparatus 221 or 231. The second interface enables interfacing between a slave processing device 240 or 250 and the sensing apparatus 221 or 231. The first interface and/or the second interface may be configured as, for example, an external bus.

The slave processing device 240 refers to a device physically distinguished from the slave BMS 220 and may be provided outside the slave BMS 220. Likewise, the slave processing device 250 refers to a device physically distinguished from the slave BMS 230, and may be provided outside or inside the slave BMS 230. For example, when the slave processing device 240 is configured to determine status information of the battery unit based on physical quantity data collected at the sensing apparatus 221, the slave processing device 240 may be provided in the slave BMS 220. When the slave processing device 240 is configured to have a control feature, such as a cell balancing feature, the slave processing device 240 may be provided outside the slave BMS 220. It is provided as an example only and a location of the slave processing device 240 is not limited thereto.

Each of the plurality of slave processing devices 240 and 250 may include a processor, for example, a micro controller unit (MCU), an application processor (AP), a graphic processing unit (GPU), and the like. Each of the plurality of slave processing devices 240 and 250 may be configured as an integrated chip (IC), for example, a field programmable gate array (FPGA), an application specific integrated circuit (ASIC), and the like.

Each of the plurality of slave processing devices 240 and 250 may include an independent module, unit, or circuit, for example, a module having a danger detection and control feature, a module having a balancing feature, etc., or may be connected to the independent module. The slave processing device 240 or 250 only may be replaced instead of replacing the sensing apparatus 221 or 231 and/or the master BMS 210. Update of an algorithm of each of the plurality of slave processing devices 240 and 250 may be easily performed and/or a process of the BMS 200 may be easily expanded. Since the slave processing device 240 uses a communication feature of the sensing apparatus 221 and the slave processing device 250 uses a communication feature of the sensing apparatus 231, a specific optimized algorithm may be installed on the plurality of slave processing devices 240 and 250.

The master processing device 211 transmits the sensing command to each of the plurality of sensing apparatuses 221 and 231. The sensing command may include time synchronization information. Thus, each of the plurality of sensing apparatuses 221 and 231 may sense a corresponding battery unit at the same point in time.

The sensing apparatus 221 senses physical quantity of the battery unit and stores physical quantity data corresponding to the sensed physical quantity in a memory. If the sensing apparatus 221 is in a sensing complete status, the slave processing device 240 may access the memory of the sensing apparatus 221 and may read the physical quantity data of the battery unit. Likewise, the sensing apparatus 231 senses physical quantity of another battery unit and stores physical quantity data corresponding to the sensed physical quantity in the memory. If the sensing apparatus 231 is in a sensing complete status, the slave processing device 250 may access the memory of the sensing apparatus 231 and read physical quantity data.

The slave processing device 240 determines status information of the battery unit and writes the status information of the battery unit into the memory of the sensing apparatus

221. The slave processing device 250 determines status information of the other battery unit and writes status information of the other battery unit into the memory of the sensing apparatus 231.

The master processing device 211 receives status information stored in the memories of the plurality of sensing apparatuses 221 and 231 from the plurality of sensing apparatuses 221 and 231, respectively. The master processing device 211 determines status information of a battery pack that includes the battery unit and the other battery unit. In one example, the master processing device 211 may transmit status information of the battery pack to an electronic control unit (ECU) within a vehicle. The ECU may display status information of the battery pack on a display within the vehicle. Depending on examples, the master processing device 211 may transmit status information of each of the battery unit and the other battery unit to the ECU. The ECU may display status information of each of the battery unit and the other battery unit on the display within the vehicle.

The description made above with FIG. 1 may be applicable to FIG. 2 and a further description is omitted.

Figure 3:
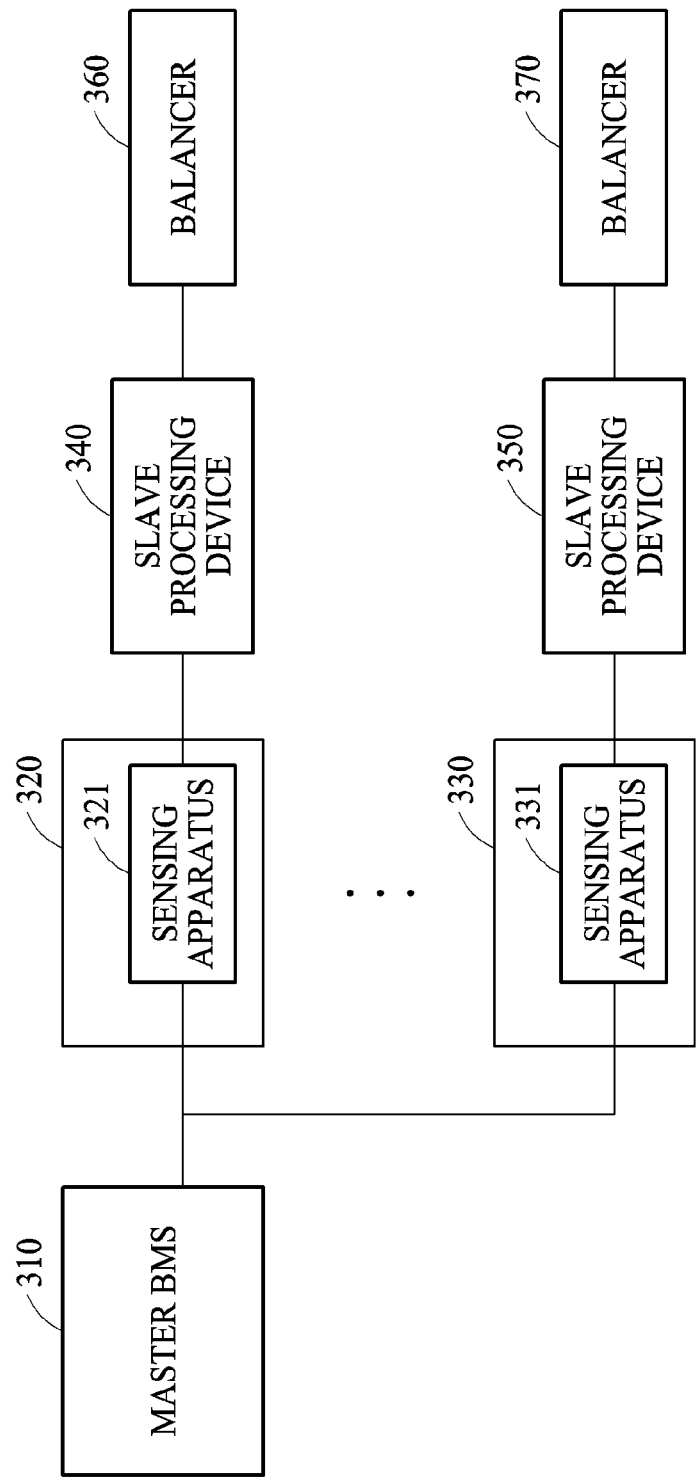
FIGS. 3, 4, and 5 illustrate examples describing balancing.
Figure 4:
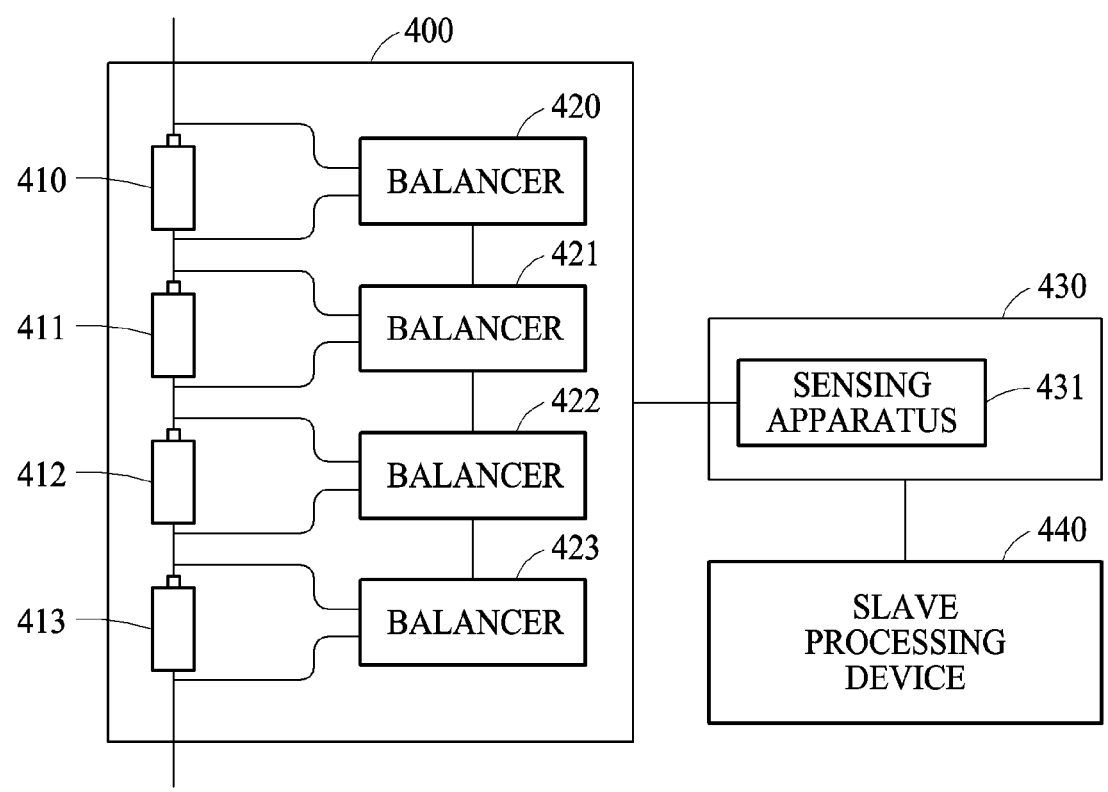
Figure 5:
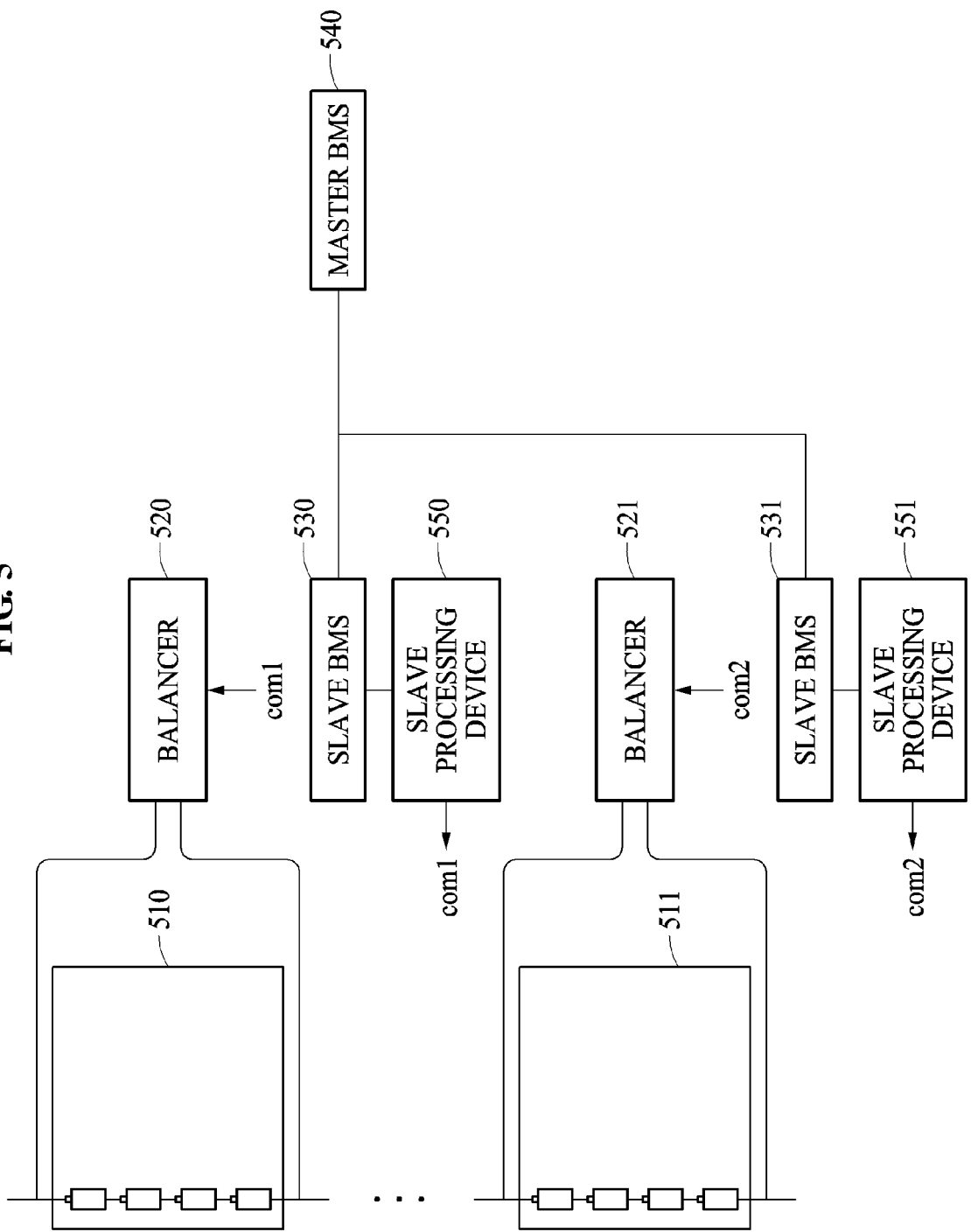

FIGS. 3 through 5 illustrate examples of describing balancing.

Referring to FIG. 3, a BMS includes a master BMS 310 and a plurality of slave BMSs 320 and 330. A slave BMS 320 includes a sensing apparatus 321 and a slave BMS 330 includes a sensing apparatus 331. The sensing apparatus 321 or 331 may be connected to a slave processing device 340 or 350, respectively, through an external bus.

In one example, the slave processing device 340 controls a balancer 360 and the slave processing device 350 controls a balancer 370. That is, balancing may be performed for each battery unit. As described above, the battery unit may be a battery cell or a battery module. Balancing may be performed for each battery cell or battery module. Hereinafter, an example of performing balancing for each battery cell is described with reference to FIG. 4 and an example of performing balancing for each battery module is described with reference to FIG. 5.

FIG. 4 illustrates a battery module 400. Referring to FIG. 4, the battery module 400 includes a plurality of battery cells 410, 411, 412, and 413. Balancers 420, 421, 422, and 423 are electrically connected to the plurality of battery cells 410, 411, 412, and 413, respectively.

A sensing apparatus 431 included in a slave BMS 430 senses physical quantity of each of the plurality of battery cells 410, 411, 412, and 413.

The physical quantity data of each of the plurality of battery cells 410, 411, 412, and 413 may be stored in the memory of the sensing apparatus 431.

A slave processing device 440 receives physical quantity data of each of the plurality of battery cells 410, 411, 412, and 413 from the sensing apparatus 431. The slave processing device 440 determines status information of each of the plurality of battery cells 410, 411, 412, and 413 based on the physical quantity data of each of the plurality of battery cells 410, 411, 412, and 413. The slave processing device 440 may determine whether balancing should be performed based on the physical quantity data and/or the status information of each of the plurality of battery cells 410, 411, 412, and 413. For example, if at least one of the plurality of battery cells 410, 411, 412, and 413 has a different voltage or SOC from the others, the slave processing device 440 may determine that balancing should be performed.

When it is determined that balancing should be performed, the slave processing device 440 may determine a target balancer to perform balancing and may generate a control signal to be transmitted to the target balancer. The slave processing device 440 may transmit the control signal to the target balancer. The target balancer may operate in response to the control signal. For example, if the battery cell 410 has the lowest voltage or SOC, the slave processing device 440 may determine the plurality of balancers 421, 422, and 423 as target balancers to match voltage or SOC of other battery cells 411, 412, and 431 to the voltage or SOC of the battery cell 410. The slave processing device 440 may transmit the control signal to each of the plurality of balancers 421, 422, and 423. Each of the plurality of balancers 421, 422, and 423 may consume the power of the corresponding battery cell 411, 412, or 413. Accordingly, status information of the plurality of battery cells 410, 411, 412, and 413 may be equalized.

The description made above with FIG. 4 is provided as an example only and balancing for each battery cell is not limited thereto.

FIG. 5 illustrates a plurality of battery modules 510 and 511. Referring to FIG. 5, a balancer 520 is electrically connected to the battery module 510 and a balancer 521 is electrically connected to the battery module 511.

A slave BMS 530 transmits physical quantity data about the battery module 510 to a master BMS 540. A slave BMS 531 transmits physical quantity data about the battery module 511 to the master BMS 540. The master BMS 540 determines status information of each of the plurality of battery modules 510 and 511 based on physical quantity data about each of the plurality of battery modules 510 and 511. The master BMS 540 determines whether balancing should be performed based on physical quantity data and/or status information of each of the plurality of battery modules 510 and 511.

When it is determined that balancing should be performed, the master BMS 540 transmits a parameter for performing balancing to each of the plurality of slave BMSs 530 and 531. Each of the plurality of slave BMSs 530 and 531 transmits the parameter to a corresponding slave processing device 550 or 551. That is, the slave BMS 530 transmits the parameter to the slave processing device 550 and the slave BMS 531 transmits the parameter to the slave processing device 551. Each of the plurality of slave processing devices 550 and 551 generates a control signal for cell balancing. Here, each of the plurality of slave processing devices 550 and 551 generates the control signal based on the parameter. Each of the plurality of slave processing devices 550 and 551 transmits the control signal to the corresponding balancer 520 or 521. In the example shown in FIG. 5, the slave processing device 550 transmits signal com1 to the balancer 520 and the slave processing device 551 transmits signal com2 to the balancer 521. Each of the plurality of balancers 520 and 521 may perform balancing based on the control signal.

In addition to the balancer described with reference to FIGS. 3 through 5, a module, a unit, or a circuit capable of performing a temperature control may be controlled by the slave processing device. The temperature control may be performed for each battery cell or battery module.

Figure 6:
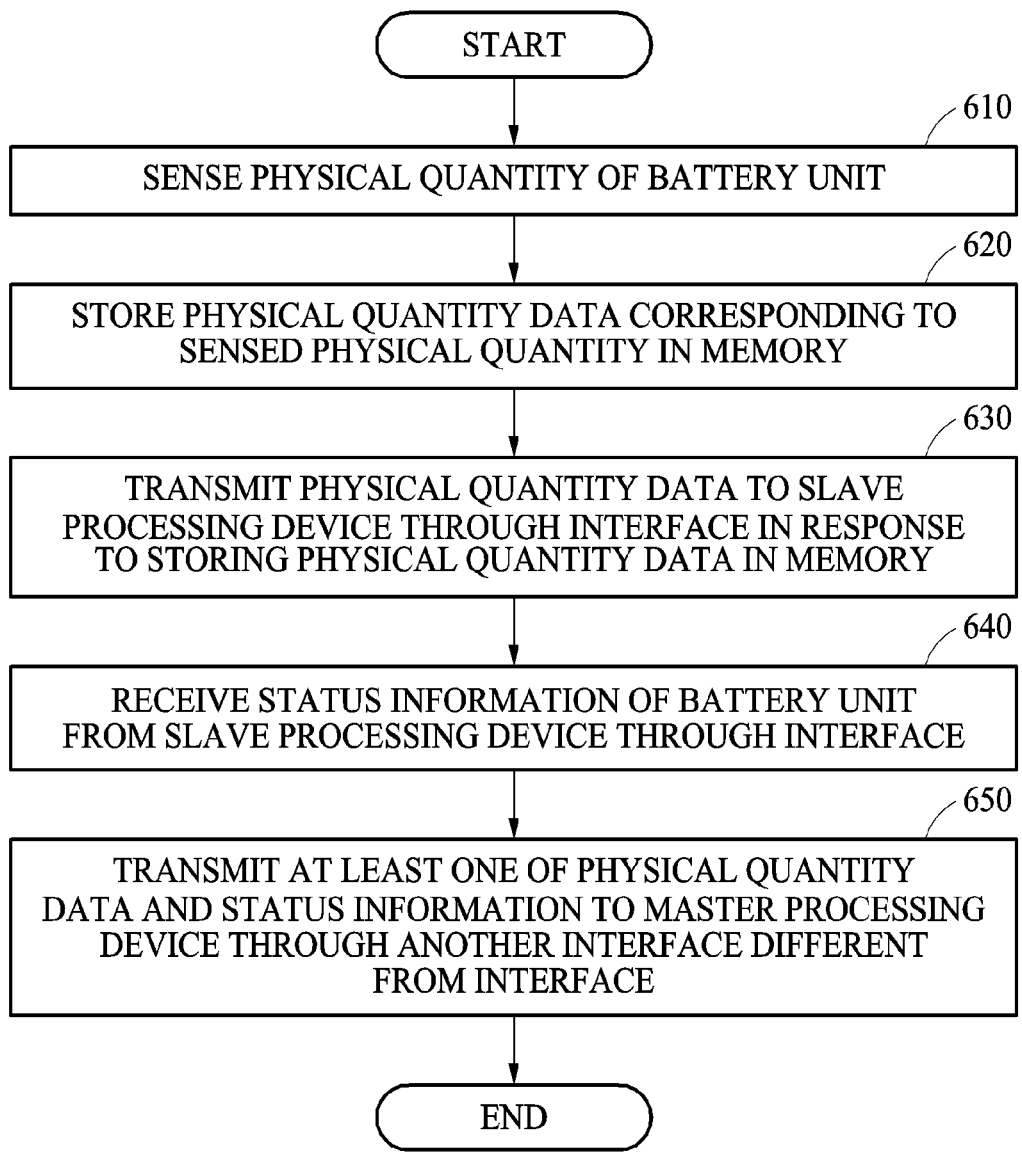
FIG. 6 is a flowchart illustrating an example of an operation method of a sensing apparatus.

FIG. 6 illustrates an example of an operation method of a sensing apparatus.

Referring to FIG. 6, in operation 610, the sensing apparatus senses a physical quantity of a battery unit.

In operation 620, the sensing apparatus stores physical quantity data corresponding to the sensed physical quantity in a memory. Here, the physical quantity data may be stored in the memory of the sensing apparatus, but could also be stored outside the sensing apparatus.

Once the physical quantity data is stored in the memory, the sensing apparatus transmits the physical quantity data to a slave processing device through an interface in operation 630. The interface corresponds to the aforementioned second interface.

In operation 640, the sensing apparatus receives status information of the battery unit from the slave processing device through the interface.

In operation 650, the sensing apparatus transmits at least one of the physical quantity data and the status information to a master processing device through another interface different from the interface. The other interface corresponds to the aforementioned first interface.

The description made above with FIGS. 1 through 5 may be applicable to FIG. 6 and a further description is omitted.

Figure 7:
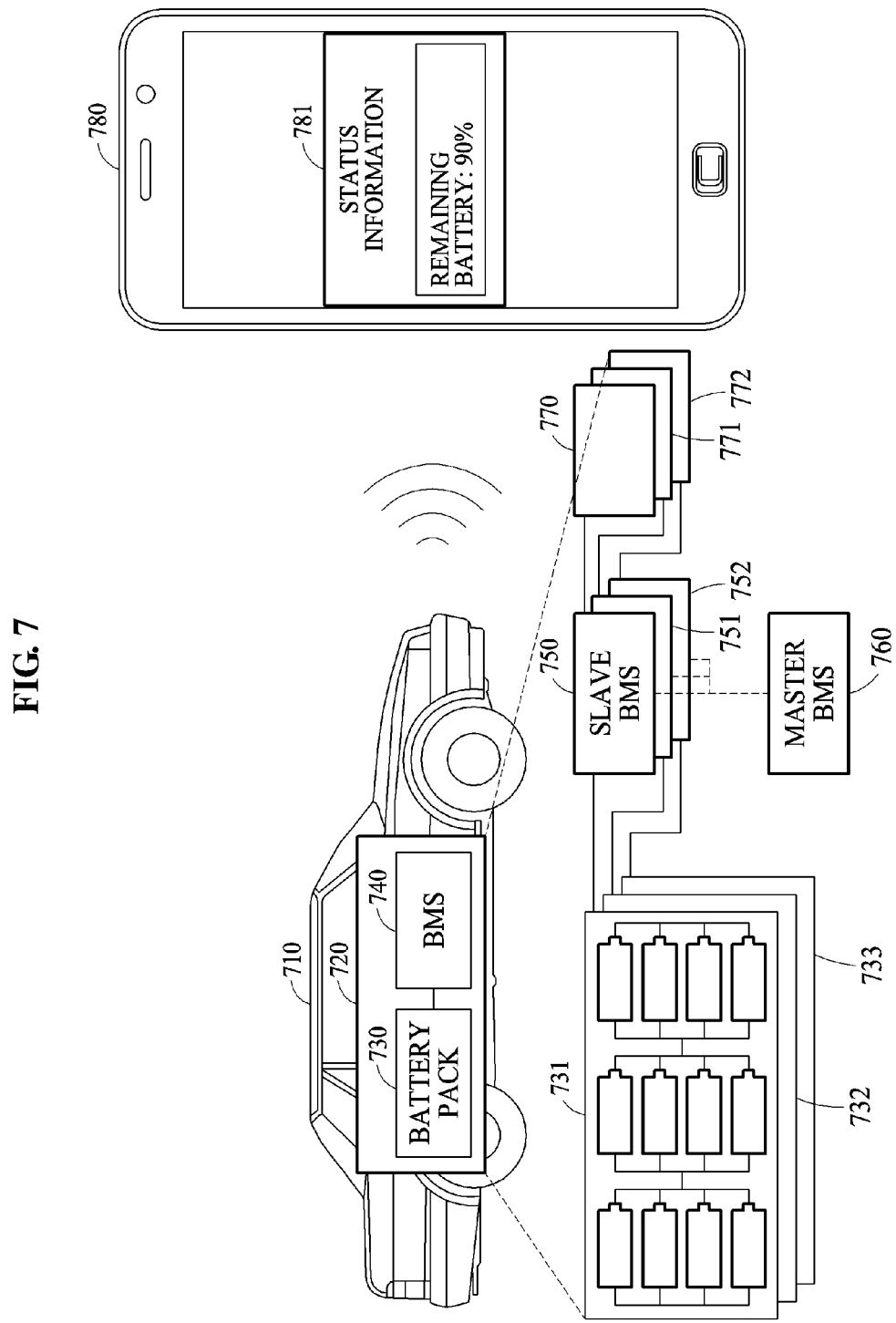
FIG. 7 illustrates an example of providing status information of a battery unit.

FIG. 7 illustrates an example of providing status information of a battery unit.

FIG. 7 illustrates a vehicle 710. The vehicle 710 may be, for example, an electrical vehicle or a hybrid vehicle.

Referring to FIG. 7, a battery system 720 includes a battery pack 730 and a BMS 740.

The battery pack 730 includes a plurality of battery modules 731, 732, and 733. Each of the plurality of battery modules 731, 732, and 733 includes a plurality of battery cells.

The BMS 740 includes the aforementioned master BMS and slave BMS. The BMS 740 includes a slave BMS 750, 751, or 752 corresponding to each of the plurality of battery modules 731, 732, and 733.

The slave BMS 750 collects physical quantity data of each of the plurality of battery cells within the battery module 731 and transmits the collected physical quantity data to a slave processing device 770. Likewise, each of other slave BMSs 751 and 752 transmits physical quantity data of each of the plurality of battery cells within the corresponding battery module 732 or 733 to a corresponding slave processing device 771 or 772.

The slave processing device 770 determines status information of each of the plurality of battery cells included in the battery module 731. The slave processing device 770 determines status information of the battery module 731. Likewise, the slave processing device 771 determines status information of each of the plurality of battery cells included in the battery module 732 and/or status information of the battery module 732. Also, the slave processing device 772 determines status information of each of the plurality of battery cells included in the battery module 733 and/or status information of the battery module 733.

Each of the plurality of slave processing devices 770, 771, and 772 transmits the determined status information to the corresponding slave BMS 750, 751, or 752. Each of the plurality of slave BMSs 750, 751, and 752 transmits the determined status information to a master BMS 760.

The master BMS 760 determines status information of the battery pack 730 based on the received status information. The master BMS 760 transmits the status information of the battery pack 730 to a user terminal 780 through a communication interface within the vehicle 710. The user terminal 780 may display status information 781 of the battery pack 730 on a display.

In one example, the BMS 740 may be applicable to a large BMS, such as an energy storage system (ESS). The BMS 740 may be applicable to an electronic device or a device management system to which a rechargeable battery is mounted.

Figure 8:
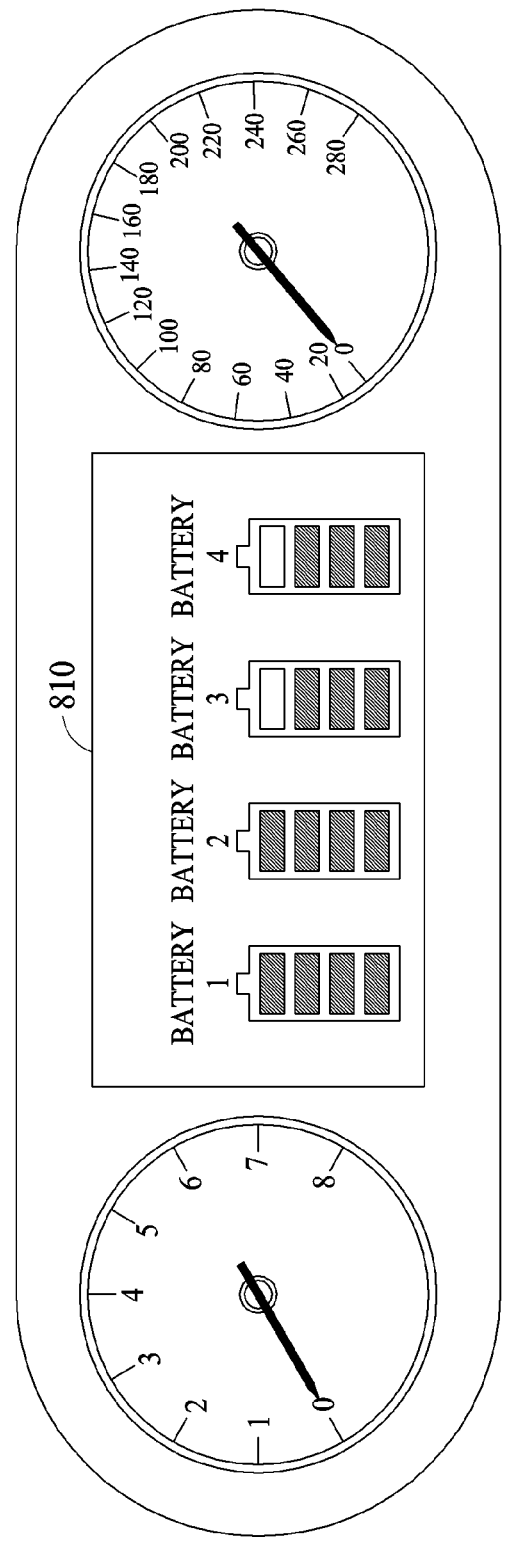
FIG. 8 illustrates another example of providing status information of a battery unit.

FIG. 8 illustrates another example of providing status information of a battery unit.

Referring to FIG. 8, status information 810 of each of a plurality of battery units is output on a dashboard display. Here, the battery unit may represent a battery cell or a battery module. Although not illustrated in FIG. 8, status information of a battery pack may be output on the dashboard display.

Examples of hardware components include controllers, sensors, generators, drivers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A sensing apparatus, comprising:
   a sensor configured to sense a quantity of a battery;
   a memory configured to store one or both of quantity data corresponding to the sensed quantity and status information of the battery;
   a first interface configured to transmit one or both of the quantity data and the status information to a master processor, wherein the sensing apparatus is coupled to the master processor through the first interface;
   a second interface configured to provide an interface between a slave processor and the memory and to transmit information about an operation status of the sensing apparatus to the slave processor, wherein the sensing apparatus is coupled to the slave processor through the second interface; and
   a controller configured to control the sensor, the memory, the first interface, and the second interface,
   wherein the slave processor is configured to access the memory and to read the quantity data in response to the operation status being a sensing complete status, determine the status information based on the quantity data, and write the status information to the memory, and
   wherein the controller is configured to control the first interface to transmit the status information to the master processor.

2. The sensing apparatus of claim 1, wherein the status information is stored in the memory separately from the quantity data.

3. The sensing apparatus of claim 1, wherein the status information comprises any one or any combination of: a charging status and a lifespan status of the battery and information regarding whether the battery is in an abnormal status, prediction information regarding whether the battery is abnormal, a balancing status of the battery, an internal resistance status of the battery, and prediction information about a temperature of the battery.

4. The sensing apparatus of claim 1, wherein:
   the battery comprises battery cells;
   the second interface is further configured to transmit quantity data of each of the battery cells to the slave processor; and
   the slave processor is configured to
      determine status information of each of the battery cells based on the quantity data of each of the battery cells,
      determine cell balancing based on status information of each of the battery cells and output a result indicative thereof, and
      generate control information to control a balancer corresponding to each of the battery cells based on the result.

5. The sensing apparatus of claim 1, wherein the controller is configured to control the sensor in response to a sensing command from the master processor, to change an operation status of the sensing apparatus in response to completion of storing of the quantity data, to control the second interface to transmit information about the changed operation status to the slave processor, and to control the first interface to transmit the quantity data stored in the memory to the master processor.

6. The sensing apparatus of claim 1, further comprising:
   a display configured to display one or both of the sensed quantity and the status information of the battery.

7. A battery management system, comprising:
   a sensing apparatus; and
   a master battery management device comprising a master processor and configured to communicate with the sensing apparatus,
   wherein the sensing apparatus comprises:
      a sensor configured to sense a quantity of a battery;
      a memory configured to store one or both of quantity data corresponding to the sensed quantity and status information of the battery;
      a first interface configured to transmit one or both of the quantity data and the status information to the master processor, wherein the sensing apparatus is coupled to the master processor through the first interface;
      a second interface configured to provide an interface between a slave processor and the memory and to transmit information about an operation status of the sensing apparatus to the slave processor, wherein the sensing apparatus is coupled to the slave processor through the second interface; and
      a controller configured to control the sensor, the memory, the first interface, and the second interface,
      wherein the slave processor is configured to access the memory and to read the quantity data in response to the operation status being a sensing complete status, determine the status information based on the quantity data, and write the status information to the memory, and wherein the controller is configured to control the first interface to transmit the status information to the master processor.

8. The battery management system of claim 7, wherein the status information is stored in a different area of the memory than an area in which the quantity data is stored.

9. The battery management system of claim 7, wherein the status information comprises any one or any combination of: a charging status and a lifespan status of the battery and information regarding whether the battery is in an abnormal status, prediction information regarding whether the battery is abnormal, a balancing status of the battery, an internal resistance status of the battery, and prediction information about a temperature of the battery.

10. The battery management system of claim 7, wherein:
the battery comprises battery cells;
the second interface is further configured to transmit quantity data of each of the battery cells to the slave processor; and
the slave processor is configured to
determine cell balancing based on the quantity data of each of the battery cells and output a result indicative thereof, and
generate control information to control a balancer corresponding to each of the battery cells based on the result.

11. The battery management system of claim 7, wherein controller configured to control the sensor in response to a sensing command from the master battery management device, to change an operation status of the slave battery management device in response to completion of storing of the physical quantity data, to control the second interface to transmit information about the changed operation status to the slave processor, and to control the first interface to transmit the quantity data stored in the memory to the master battery management device.

12. A method of a sensing apparatus, comprising:
sensing a quantity of a battery and storing the quantity data in a memory;
transmitting information about an operation status of the sensing apparatus to the slave processor through a first interface of the sensing apparatus, wherein the slave processor is configured to access the memory through the first interface, read the quantity data in response to the operation status being a sensing complete status, and determine the status information based on the quantity data;
receiving the status information of the battery from the slave processor through the first interface; and
transmitting one or both of the quantity data and the status information to a master processor through a second interface,
wherein the sensing apparatus is coupled to the slave processor through the first interface, and is coupled to the master processor through the second interface.

* * * * *